United States Patent
Nakahara et al.

(10) Patent No.: US 7,583,714 B2
(45) Date of Patent: Sep. 1, 2009

(54) VERTICAL CAVITY SURFACE EMITTING SEMICONDUCTOR LASER DEVICE

(75) Inventors: Kouji Nakahara, Kunitachi (JP); Koichiro Adachi, Musashino (JP); Takashi Shiota, Sagamihara (JP); Tomonobu Tsuchiya, Hachioji (JP); Kazunori Shinoda, Musashino (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/679,349

(22) Filed: Feb. 27, 2007

(65) Prior Publication Data

US 2008/0144683 A1    Jun. 19, 2008

(30) Foreign Application Priority Data

Dec. 13, 2006    (JP) .............................. 2006-335252

(51) Int. Cl.
    *H01S 5/00* (2006.01)
(52) U.S. Cl. .............. 372/45.01; 372/50.11; 372/50.124
(58) Field of Classification Search .............. 372/45.01, 372/50.11, 50.124
    See application file for complete search history.

(56) References Cited

U.S. PATENT DOCUMENTS

2006/0002444 A1*    1/2006    Wang et al. ................. 372/50.1
2006/0062266 A1*    3/2006    Jewell ...................... 372/43.01
2006/0274801 A1*    12/2006   Tandon et al. ............. 372/45.01

FOREIGN PATENT DOCUMENTS

| JP | 2004-179274 | 6/2004 |
|----|-------------|--------|
| JP | 2005-175111 | 6/2005 |
| JP | 2005-223351 | 8/2005 |
| JP | 2006-186400 | 7/2006 |
| JP | 2006-196484 | 7/2006 |

OTHER PUBLICATIONS

Lin et al. ("High Temperature Continuous Wave Operation of 1.3 and 1.55 um VCSELs With InP Air-Gap DBRs", IEEE Journal of Selected Topics in Quantum Electronics, vol. 9, No. 5, Sep./Oct. 2003, pp. 1415-1421).*

* cited by examiner

*Primary Examiner*—Minsun Harvey
*Assistant Examiner*—Tod T Van Roy
(74) *Attorney, Agent, or Firm*—Antonelli, Terry, Stout & Kraus, LLP.

(57) ABSTRACT

The relationship between the reflectivity characteristic of a DBR layer(s), in which an InP layer and an InGaAlAs layer are laminated alternatively, and the optical absorption characteristic of the InGaAlAs layer, is a trade-off in a vertical cavity surface emitting laser on an InP substrate. The present invention applies a semiconductor DBR layer(s), in which an InP layer and an InGaAlAs-MQW (multi-quantum-wells) layer are laminated alternatively, in order to dissolve the above trade-off. The InGaAlAs-MQW layer is composed of InGaAlAs-wells and barriers. The InP layer is doped uniformly and the InGaAlAs-MQW layer has a structure in which at least a part thereof is doped.

6 Claims, 4 Drawing Sheets

VERTICAL CAVITY SURFACE EMITTING SEMICONDUCTOR LASER DEVICE

INCORPORATION BY REFERENCE

The present application claims priority from Japanese application JP2006-335252 filed on Dec. 13, 2006, the content of which is hereby incorporated by reference into this application.

FIELD OF THE INVENTION

The present invention relates to vertical cavity surface emitting semiconductor laser devices, particularly laser devices using semiconductor, more particularly semiconductor lasers for optical communication, modulators, and integrated light sources integrating the same which are used as a light source of optical fibers.

BACKGROUND OF THE INVENTION

The worldwide spread of the Internet is increasing the amount of the data traffic in optical communication networks year by year. To address such increase, there is a need for higher performances, such as further speed up, further reduction in power consumption and the like, in the semiconductor light sources and modulators that are key devices in optical fiber communication networks or the integrated light sources integrating the same. Until now, edge emitting lasers using a cleave of a compound semiconductor as a facet have predominated. However, in recent years, the research and development of vertical cavity surface emitting lasers that emit light vertically to a surface of a wafer are actively conducted. FIG. 3 shows a cross-sectional structural view of a vertical cavity surface emitting laser lasing in a general wavelength of 850 nm band. In FIG. 3, n-type DBR (Distributed Bragg Reflector) layer(s) 302 are laminated on a GaAs substrate 301. The DBR layers 302 need a high reflectivity of 99 to 99.9% for the purpose of laser oscillation, and is composed of 35 pairs of reflective film layer pairs of n-type $Al_{0.9}Ga_{0.1}As$ layers 302a and n-type $Al_{0.15}Ga_{0.85}As$ layers 302b wherein the reflective film layer pair has different refractive indexes.

The refractive index difference in these layers is approximately 0.4. Moreover, the film thickness d of the respective DBR layers 302a and 303b is given by $d=\lambda/4n_r$, wherein $n_r$ is the refractive index of the semiconductor and $\lambda$ is the oscillation wavelength. On the n-type DBR layers 302, an n-type $Al_{0.3}Ga_{0.7}As$-spacer layer 303, a $GaAs/Al_{0.3}Ga_{0.7}As$ MQW active layer 304, and a p-type $Al_{0.3}Ga_{0.7}As$-spacer layer 305 are continuously laminated, and a p-type DBR layer 307 is furthermore laminated. The p-type DBR layer is composed of 30 pairs of reflective film layer pairs wherein the reflective film layer pair is composed of a p-type $Al_{0.9}Ga_{0.1}As$ layer 307a and a p-type $Al_{0.15}Ga_{0.85}As$ layer 307b. A partial region layer of the p-type $Al_{0.9}Ga_{0.1}As$ layer 307a of the lowest layer in the p-type DBR layer 307 is replaced with a p-type $Al_{0.98}Ga_{0.02}As$ layer, the outer periphery of which is oxidized to form an AlOx-oxidation layer 306. On the p-type DBR layer 307 is formed a p+-type GaAs layer, and a light emission aperture portion is removed. Reference numeral 309 represents a $SiO_2$ passivation layer, reference numeral 310 represents an electrode for p-type semiconductor, and reference numeral 311 represents an electrode for n-type semiconductor provided on the back surface of the substrate. In such wavelength of 850 nm band, the vertical cavity surface emitting lasers has been already put in practical use.

BRIEF SUMMARY OF THE INVENTION

On the other hand, many of the long wavelength vertical cavity surface emitting lasers in the range from 1.3 μm band to 1.55 μm band applicable to optical fiber communications are still in the research stage and have not become popular.

One of the reasons why the long wavelength vertical cavity surface emitting lasers are still in the research stage is due to a problem that in the long wavelength vertical cavity surface emitting lasers the refractive index difference in a pair of semiconductors of the DBR layer made of semiconductor is small. In the long wavelength vertical cavity surface emitting laser prepared on an InP substrate, the DBR layer is, for example, formed of a pair of InP and InGaAsP, or a pair of InP and InGaAlAs. However, the refractive index difference is as small as approximately 0.17 to 0.20, compared with 0.4 of the above-described 850 nm band. In the 1.3 μm band, the refractive index of InP is 3.207, the refractive index of InGaAsP having a wavelength that defines a composition of a compound semiconductor of 1.15 μm is 3.379, and that of InGaAlAs having a wavelength that defines a composition of a compound semiconductor of 1.18 μm is 3.4037.

Here, a wavelength $\lambda g$ (μm) that defines a composition of a compound semiconductor is a peak wavelength when measuring a mixed crystal semiconductor by means of photo luminescence, and has a relationship of $Eg=1.2398/\lambda g$ with respect to bandgap Eg (eV). (Precisely speaking, Eg given by the above-described equation is slightly larger than Eg which a semiconductor normally has because band-filling occurs at the time of photoluminescence emission, however, this equation is often conveniently used in this technical field) In this case, in order to achieve DBR layers having a high reflectivity of approximately 99 to 99.9%, it is necessary to increase the number of layers of semiconductor pairs of the DBR layer or to change to the composition having a high refractive index difference.

In the latter case, the wavelength that defines a composition of a compound semiconductor of InGaAsP or InGaAlAs needs to be increased. However, as the wavelength that defines a composition of a compound semiconductor is increased, the light absorption of the layer increases due to the oscillation wavelength of the laser, resulting in a problem that the effective reflectivity cannot be increased. Particularly, this problem becomes significant in the case where the DBR layer is doped with impurities so that the current can be injected into the active layer through the DBR layer(s).

FIG. 4 schematically shows a relationship of the optical absorption and wavelength between an undoped semiconductor which does not introduce impurities and a doped semiconductor. Here, a bulk indicates a semiconductor among alloyed compound semiconductors, whose composition is constant and uniform, i.e. a semiconductor layer whose bandgap is constant. Although an undoped semiconductor absorbs light up to the wavelength corresponding to bandgap Eg which the semiconductor has, the optical absorption does not occur above this wavelength and thus the semiconductor become transparent.

On the other hand, in a doped semiconductor, the absorption occurs even at the wavelength equal to or more than the wavelength corresponding to a bandgap Eg which this semiconductor has, because a band tail phenomenon occurs. Accordingly, the doped DBR layer has a problem that the optical absorption at the oscillation wavelength of the laser causes the reduction of the effective reflectivity. Moreover, this problem becomes significant at high temperatures because the wavelength corresponding to the bandgap shifts to the longer wavelength side at 0.6 to 0.7 nm/° C. as temperature rises.

It is one objection of the present invention to provide vertical cavity surface emitting lasers having a structure of semiconductor pairs, whose optical absorption is small at the wavelength corresponding to the oscillation wavelength, whose refraction difference is large, and whose electric resistance is small in a DBR layer composed of semiconductor.

Other objects, features and advantages of the invention will become apparent from the following description of the embodiments of the invention taken in conjunction with the accompanying drawings.

DESCRIPTION OF REFERENCE NUMERALS

Figure 1:
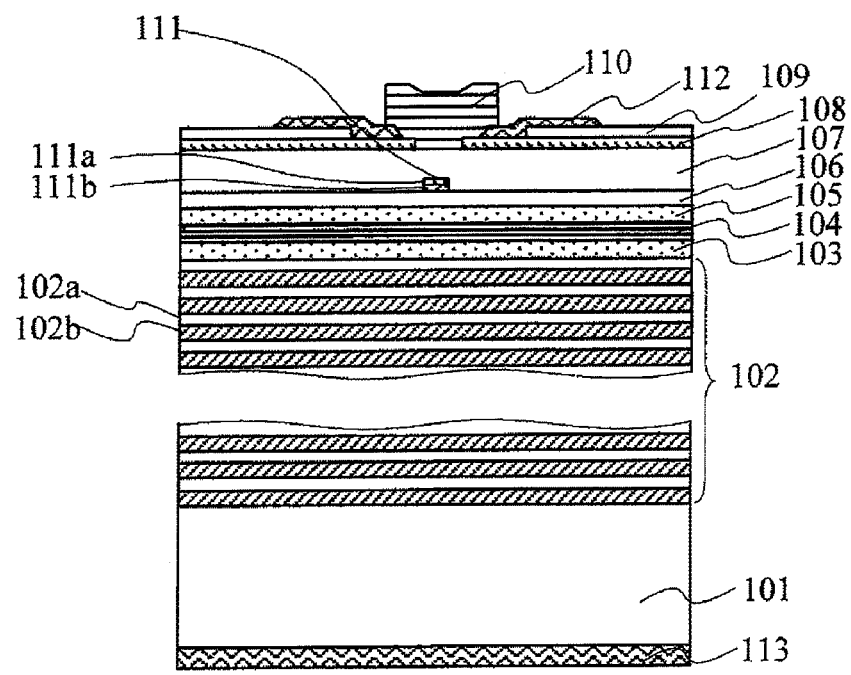
FIG. 1 is a structural view showing an example of the present invention.

101: n-type InP substrate, 102: n-type semiconductor DBR (distributed Bragg-reflector) layer(s), 102a: n-type InP layer, 102b: InGaAlAs-MQW (multi-quantum-wells) layer, 103: n-type spacer layer, 104: MQW active layer, 105: p-type spacer layer, 106: p-type InP layer, 107: n-type InP layer, 108: n-type InGaAs contact layer, 109: $SiO_2$ passivation layer, 110: dielectric DBR layer (s), 111: InGaAlAs-tunnel junction, 111a: $n^+$-type InGaAlAs layer, 111b: $p^+$-type InGaAlAs layer, 112: electrode for n-type semiconductor, 113: electrode for n-type semiconductor, 201: InGaAlAs-well, 202: InGaAlAs-barrier, 301: n-type GaAs substrate, 302: n-type DBR layer (s), 302a: n-type $Al_{0.9}Ga_{0.1}As$ layer, 302b: n-type $Al_{0.15}Ga_{0.85}As$ layer, 303: n-type $Al_{0.3}Ga_{0.7}As$-spacer layer, 304: $GaAs/Al_{0.3}Ga_{0.7}As$ MQW, 305: p-type $Al_{0.3}Ga_{0.7}As$-spacer layer, 306: AlOx-oxidation layer, 307: p-type DBR layer(s), 307a: p-type $Al_{0.9}Ga_{0.1}As$ layer, 307b: p-type $Al_{0.15}Ga_{0.85}As$ layer, 308: $p^+$-type GaAs layer, 309: $SiO_2$ passivation layer, 310: electrode for p-type semiconductor, 311: electrode for n-type semiconductor, 601: bulk DBR layer(s), 601a: n-type InP layer, 601b: n-type InGaAlAs layer, 701: undoped bulk DBR layer(s), 701a: undoped InP layer, 701b: undoped InGaAlAs layer, 801: DBR layer(s), 801a: undoped InP layer, 801b: air gap layer

DETAILED DESCRIPTION OF THE INVENTION

One aspect of the present invention is as follows:
A vertical cavity surface emitting laser device for emitting light vertically to an InP substrate, comprising an active layer that generates light onto the InP substrate and a cavity-structure in which the upper and lower sides of the active layer are sandwiched by first and second reflectors in order to obtain a lasing light from light generated from the active layer, wherein the first reflector laminated on the InP substrate is composed of first semiconductor layers, the active layer is laminated above the first reflector, and the second reflector laminated above this active layer is composed of second semiconductor layers or first dielectric layers, wherein a partial region of the first semiconductor layers is doped with impurities as to be a first conductivity type so that current can be injected from the first semiconductor layers to the active layer, and the first semiconductor layers comprise a plurality of pairs of a multi-quantum-wells layer and an InP layer wherein the plurality of pairs are laminated alternatively and the multi-quantum-wells layer is composed of InGaAlAs-wells and InGaAlAs-barriers.

The problems to be solved by the above example of the present invention can be improved by the following structure:

A vertical cavity surface emitting semiconductor laser device for emitting light vertically to an IP substrate, comprising an active layer that generates light onto the InP substrate and a cavity-structure in which the upper and lower sides of the active layer are sandwiched by reflectors in order to obtain a lasing light from light generated from the active layer, wherein at least one of the reflectors is composed of semiconductor layers, and a partial region of the semiconductor layers is doped as to be a first conductivity type so that current can be injected into the active layer, and the semiconductor layers comprise at least two or more pairs of a multi-quantum-wells layer and an InP layer, wherein the at least two or more pairs are laminated alternatively and the multi-quantum-wells layer is composed of InGaAlAs-wells and an InGaAlAs-barriers.

Since of the first semiconductor layers, a layer having a lower bandgap is composed of a quantum well structure made of InGaAlAs material, the band tail is less likely to occur even if doped, thereby allowing the optical absorption in the semiconductor layers to be reduced drastically. As a result, the lasing properties, such as a threshold current, slope efficiency, and the like, can be improved.

The present invention can provide a structure of semiconductor DBR layers having a small optical absorption at the wavelength corresponding to the laser wavelength, large refraction difference, and low electric resistance in a vertical cavity surface emitting laser, simultaneously, thereby achieving a low threshold current and an optical output power over a wide range of temperatures.

Example 1

Example 1 is an example in the case where the present invention is applied to a vertical cavity surface emitting laser of 1.3 μm band for optical fiber communications. FIG. 1 is a schematic view of this cross-sectional structure. In FIG. 1, an n-type semiconductor DBR layer(s) 102 is laminated on an n-type InP substrate 101. The DBR layer(s) 102 is composed of a pair of semiconductor layers of an InP layer 102a and an InGaAlAs multi-quantum-wells layer 102b, and the number of pairs thereof is set to 45, and the reflectivity is 99.5%. On the DBR layer(s) 102, an n-type spacer layer 103, an InGaAlAs quantum well active layer 104, and a p-type spacer layer 105 are laminated in the order. Moreover, on top thereof is laminated a p-type InP layer 106. In part on the p-type Inp layer 106 is formed a tunnel junction 111 having the wavelength that defines a composition of a compound semiconductor of 1.15 μm. The tunnel junction is a pn junction in which high-concentration n-type impurities and p-type impurities are introduced and which has a large reverse current unlike the ordinary pn junction. That is, if a positive voltage is applied to the n side of the tunnel junction, the current flows through low resistance. The tunnel junction provided in a part on the p-type semiconductor layer of the semiconductor laser provides the following advantages. First, the reduction in the volume of the p-type semiconductor by using the tunnel junction provides excellent lasing properties because the optical loss of the p-type semiconductor is high especially in a long wavelength band of 1.2 μm or more. Moreover, the device resistance can be reduced because the resistivity of the n-type semiconductor is smaller than that of the p-type semiconductor. Moreover, the threshold current can be reduced because the tunnel junction provided only in a part of the semiconductor on the active layer allows current to be injected only to the active layer in a partial region. The introduction of the tunnel junction in this way can improve the properties of the conventional semiconductor laser significantly. Especially in vertical cavity surface emitting lasers of which the effective length of a cavity is short and the volume of the active layer is small, the lasing properties are sensitive to the optical loss or the device resistance, and thus the introduction of the tunnel junction can improve the lasing properties. The tunnel junction 111 has a structure that laminates a $p^+$-type InGaAlAs layer 111b having the doping concentration of $2\times10^{19}$ cm$^{-3}$ and the film thickness of 20 nm, and an $n^+$-type InGaAlAs layer 111a having the doping concentration of $3\times10^{19}$ cm$^{-3}$ and the film thickness of 20 nm. On top thereof are laminated an n-type InP layer 107 and an n-type InGaAs contact layer 108. A partial region of the contact layer 108 is removed and a dielectric DBR layer 110 is laminated in contact with this portion. In the dielectric DBR layer 110, five pairs of AlOx layer and α-Si layer are laminated alternatively, providing a reflectivity of 99.3%. Reference numeral 109 represents a $SiO_2$ protective layer, and reference numerals 112 and 113 represent electrodes capable of making an ohmic contact to an n-type semiconductor. Since a positive voltage is applied to the electrode 112, and electrons flowing through the n-type InP layer 107 are converted into holes at the interface of the tunnel junction 111, the holes in the p-type spacer layer 106 will flow downward and be injected into the quantum well active layer 104.

Electrons are injected from the bottom electrode for n-type semiconductor 113 and are injected into the quantum well active layer 104 through the DBR layer 102 and n-type spacer layer 103.

Figure 2:
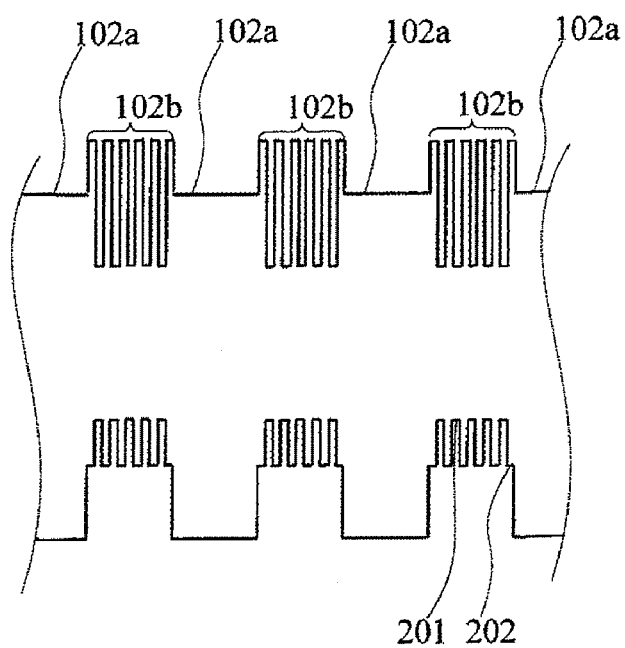
FIG. 2 is a structural view showing an example of the present invention.
Figure 3:
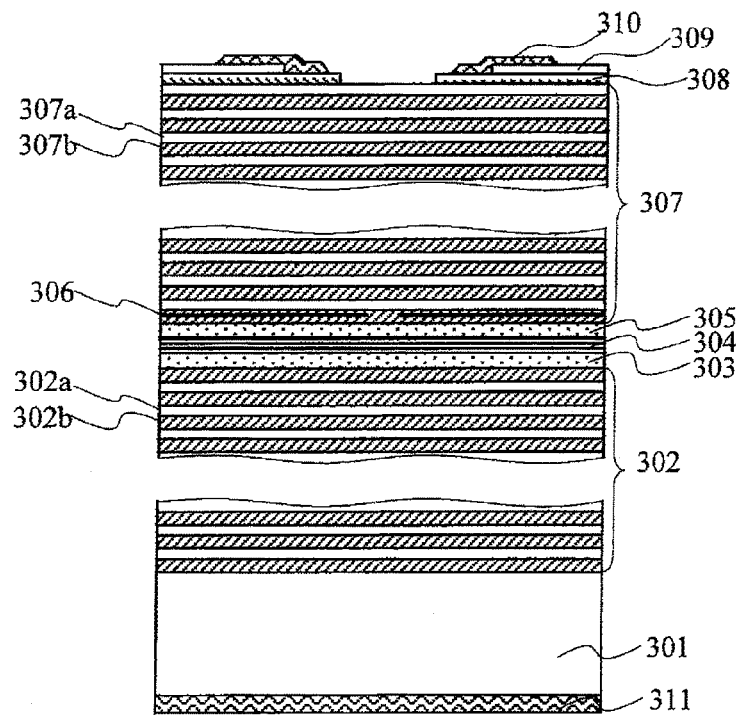
FIG. 3 is a structural view showing a conventional example.
Figure 4:
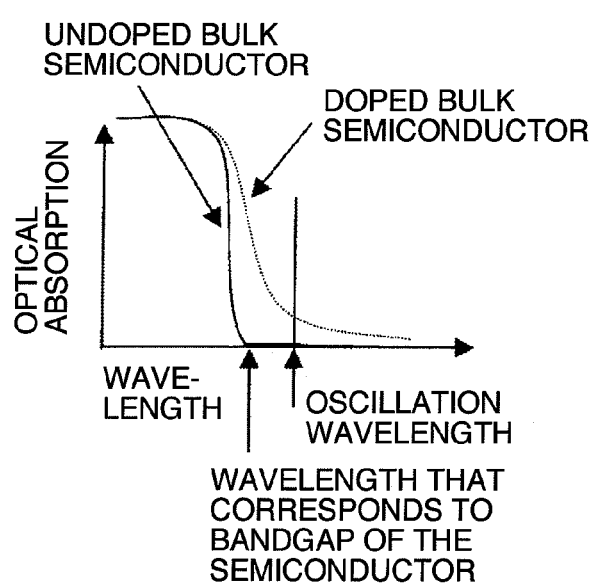
FIG. 4 is a view showing a conventional characteristic.

FIG. 2 shows a part of the DBR layer(s) 102 in detail. As described above, the n-type InP layer 102a and the n-type InGaAlAs quantum wells layer 102b are laminated alternatively. The doping concentration of the InP layer 102a is $1\times10^{18}$ cm$^{-3}$ and the film thickness thereof is 101 nm. The InGaAlAs multi-quantum-wells layer 102b is composed of a well 201 having the wavelength that defines a composition of a compound semiconductor of 1.36 μm, the film thickness of 5 nm, and the doping concentration of $1\times10^{18}$ cm$^{-3}$, and a barrier 202 having the wavelength that defines a composition of a compound semiconductor of 0.95 μm, the film thickness of 5 nm, and the doping concentration of $1\times10^{18}$ cm$^{-3}$, and 9 layers of wells and 10 layers of barriers are laminated alternatively. The multi-quantum-wells layer 102b in FIG. 2 is schematically shown.

Figure 5:
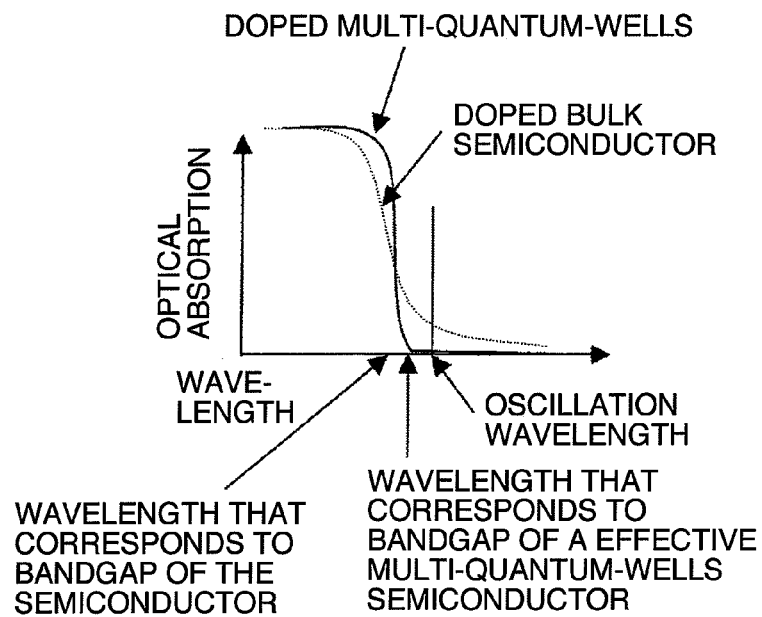
FIG. 5 is a view showing an advantage of the present invention.

Since quantum levels are formed in this multi-quantum-wells layer, the wavelength corresponding to the bandgap is 1.209 μm according to a numerical computation. Although the refractive index is 3.408 in the geometric mean of the refractive indexes of the well and barrier, the publication "Optical properties of Super Lattice Structure and its Applications" by Hiroshi Okamoto, p. 71 to p. 67, Corona Publishing Co., Ltd., discloses that the refractive index of a quantum well structure becomes large compared with the averaged one, and thus the refractive index of this multi-quantum-wells layer is expected to be larger. In the bulk semiconductor, as described above, the application of doping produces a band tail, thereby increasing the optical absorption in the wavelength region longer than the wavelength corresponding to the bandgap. However, in the quantum well structure this effect can be significantly suppressed according to the publication "Optical properties of Super Lattice Structure and its Applications" by Hiroshi Okamoto, p. 57 to p. 59, Corona Publishing Co., Ltd. Accordingly, the wavelength dependencies of the optical absorption in the doped bulk semiconductor and multi-quantum-wells layer are as shown in FIG. 5, and thus the structure of the multiple quantum wells can reduce the optical absorption. Although in this example the doping concentrations of the well and the barrier are the same, the band tail can be further suppressed if the carrier concentration of the well is set to be low with respect to that of the barrier. Moreover, if the well is undoped, then there is originally no effect of the band tail. And thus, carriers in the barrier diffuse into the well having a low energy, thereby suppressing the optical absorption without increasing the resistance of the DBR layer(s), and also increasing the refractive index. In addition, there is little effect of the band tail due to the doping because the wavelength that defines a composition of a compound semiconductor of the barrier is sufficiently short compared with the oscillation wavelength of the laser, i.e. the bandgap is high. The same is true for the InP layer 102a.

The doping concentration of the DBR layer(s) is preferably $1\times10^{17}$ cm$^{-3}$ or more, where the resistivity is sufficiently low with respect to the resistivity of the p-type semiconductor. The resistivity of n-type InP of $1\times10^{17}$ cm$^{-3}$ is approximately $10^{-2}$ Ωcm. On the other hand, the resistivity of InP, when the doping concentration is $1\times10^{18}$ cm$^{-3}$ with a low resistivity in a p-type semiconductor, is approximately $10^{-1}$ Ωcm, and thus the resistivity of p-type semiconductor is higher. As a result, the resistance of n-type semiconductor can be neglected in design. On the other hand, the upper limit of the doping concentration of the DBR layer(s) is limited by the optical loss due to a plasma effect of electrons and is set to approximately $4\times10^{18}$ cm$^{-3}$.

For the threshold current of the vertical cavity surface emitting laser according to this example, low values such as 0.8 mA at 25° C., 1.8 mA at 85° C., and 2.4 mA even at 100° C. can be obtained due to the reduction in the optical absorption of the semiconductor DBR layer, and for the maximum optical output power, 1.2 mW at 85° C. and 0.9 mW at 100° C. can be obtained. When a test operation at 10 Gb/s is carried out using this vertical cavity surface emitting laser, an excellent eye opening with the extinction ratio of 4.5 dB can be obtained in the range from 0° C. to 100° C. at a low current value of driving current of 12 mA.

The preferable wavelength that defines a composition of a compound semiconductor of the well 201 in the InGaAlAs multi-quantum-wells layer 102b, in the case of a vertical cavity surface emitting laser of 1.3 μm band, is in the range from 1.2 μm to 1.45 μm from the view points of the optical absorption and refractive index, and the film thickness is preferably in the range from 2 nm to 10 nm from the viewpoint of a quantum effect. For the barrier, similarly, the wavelength that defines a composition of a compound semiconductor is preferably in the range from 0.87 μm to 1.0 μm, and the film thickness is preferably in the range from 4.5 nm or more from the viewpoint that the wave functions of adjacent quantum wells are not coupled to each other. Moreover, it is preferable that the lattice constant of the InGaAlAs multi-quantum-wells layer 102b matches that of the InP substrate because InGaAlAs multi-quantum-wells layer 102b laminates a large number of layers. In addition, the InGaAlAs quantum well active layer 104 is preferably a quantum well layer introducing distortion from the viewpoint of lasing properties.

Furthermore, in this example, although an example in the case where the present invention is applied to a vertical cavity surface emitting laser of 1.3 µm band has been described, a similar advantage can be obtained even if the present invention is applied to a vertical cavity surface emitting laser of 1.55 µm band.

Example 2

Figure 6:
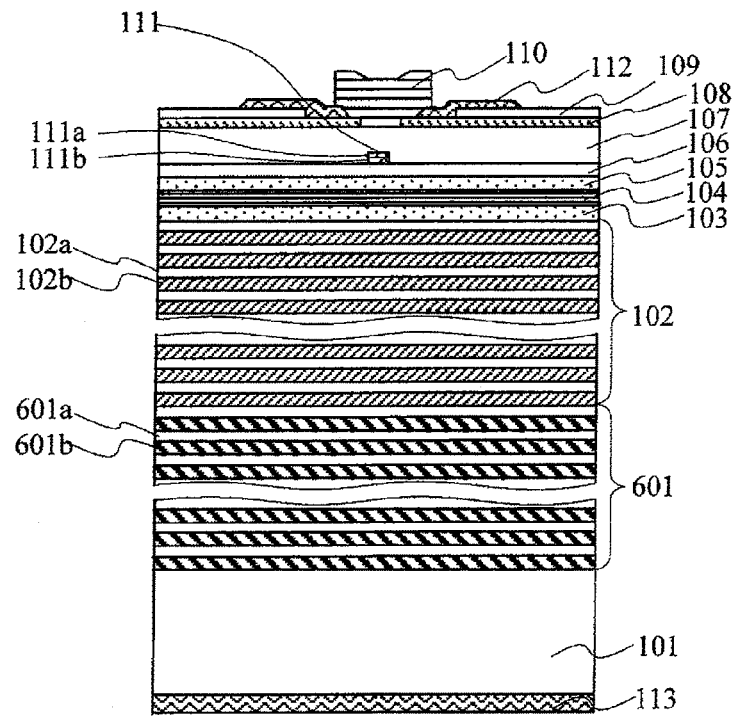
FIG. 6 is a structural view showing an example of the present invention.

Example 2 is an example in the case where the present invention is applied to a vertical cavity surface emitting laser of 1.3 µm band for optical fiber communications. FIG. 6 is a schematic view of this cross-sectional structure. The structure above the DBR layer(s) 102 is the same as that of Example 1. However, in this example, the number of semiconductor layer pairs of the n-type InP layer 102*a* and n-type InGaAlAs multi-quantum-wells layer 102*b* in the DBR layer(s) 102 is 10 pairs, and a bulk DBR layer(s) 601 is formed below the DBR layer(s) 102. The bulk DBR layer(s) 601 has a structure in which 35 pairs of n-type InP layer 601*a* and n-type InGaAlAs layer 601*b* are laminated alternatively, the n-type InGaAlAs layer 601*b* being a bulk and of which the wavelength that defines a composition of a compound semiconductor being 1.18 µm. The lamination of the DBR layer(s) 102 and bulk DBR layer(s) 601 can provide a reflectivity of 99.5%. It takes skills and time to manufacture the InGaAlAs quantum wells layer 102*b* in this composite structure, and the large parts of absorption of light into the DBR layer(s) structure are approximately 10 pairs. Thus, even if the lower parts thereof are replaced with the bulk DBR layer(s), the changes of the device properties are minimal. Each carrier concentration of the n-type InP layer 601*a* and the n-type InGaAlAs layer 601*b*, which is a bulk and has wavelength that defines a composition of a compound semiconductor of 1.18 µm is $1\times10^{18}$ cm$^{-3}$. The upper and lower limits of the doping concentration of the bulk DBR layer(s) is in the range from $1\times10^{17}$ cm$^{-3}$ to $4\times10^{18}$ cm$^{-3}$ for the same reasons as Example 1. For the vertical cavity surface emitting laser of this example, low values such as 1.0 mA at 25° C., 2.4 mA at 85° C., and 3.0 mA even at 100° C. can be obtained, and for the maximum optical output power, 1.0 mW at 85° C. and 0.7 mW at 100° C. can be obtained. When a test operation at 10 Gb/s is carried out using this vertical cavity surface emitting laser, an excellent eye opening with the extinction ratio of 4 dB can be obtained in the range from 0° C. to 100° C. at a low current value of modulation current of 15 mA.

Example 3

Figure 7:
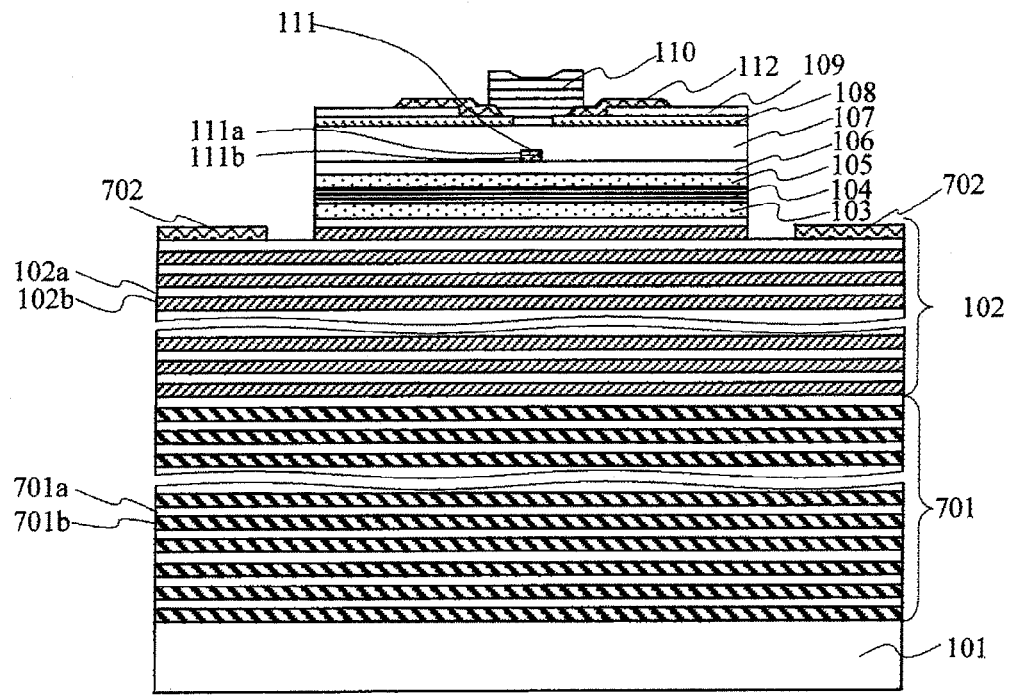
FIG. 7 is a structural view showing an example of the present invention.

Example 3 is an example in the case where the present invention is applied to a vertical cavity surface emitting laser of 1.3 µm band for optical fiber communications. FIG. 7 is a schematic view of this cross-sectional structure. The structure above the DBR layer(s) 102 is the same as Example(s) 1 and 2. However, as in the case of Example 2, the number of semiconductor layer pairs of the n-type InP layer 102*a* and n-type InGaAlAs multi-quantum-wells layer 102*b* in the DBR layer(s) 102 is 10 pairs in this example. An undoped bulk DBR layer(s) 701 is provided below the DBR layer(s) 102. The bulk DBR layer(s) 701 has a structure in which 35 pairs of undoped InP layer 701*a* and undoped InGaAlAs layer 701*b* are laminated alternatively, the undoped InGaAlAs layer 701*b* being a bulk and having the wavelength that defines a composition of a compound semiconductor of 1.18 µm. The lamination of the DBR layer(s) 102 and bulk DBR layer(s) 701 can provide a reflectivity of 99.5%. Moreover, although in Example 1 and Example 2 the electrode for n-type semiconductor 113 is provided below the substrate, an electrode for n-type semiconductor 702 in this example is provided on the n-type InP layer 102*a* of the DBR layer(s) 102 because the bulk DBR layer(s) 701 is undoped. This composite structure is a structure suppressing the absorption of light into the bulk DBR layer(s) 701 by undoping as compared with the doped bulk DBR layer(s) 601 in Example 2. Thus, the composite structure in this example combines ease of manufacture and improvement of the properties. For the threshold current of the vertical cavity surface emitting laser according to this example, low values such as 0.9 mA at 25° C., 2.0 mA at 85° C., and 2.6 mA even at 100° C. can be obtained by the reduction in the optical absorption of the semiconductor DBR layer (s), and for the maximum optical output power, 1.1 mW at 85° C. and 0.85 mW at 100° C. can be obtained. When a test operation at 10 Gb/s is carried out using this vertical cavity surface emitting laser, an excellent eye opening with the extinction ratio of 4.2 dB can be obtained in the range from 0° C. to 100° C. at a low current value of driving current of 14 mA.

Example 4

Figure 8:
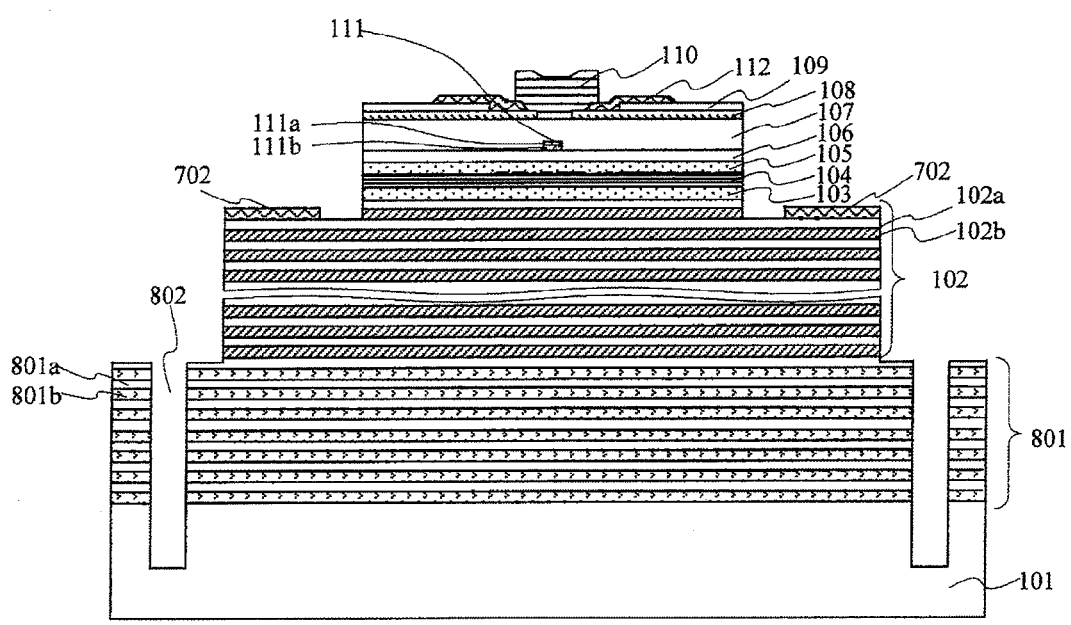
FIG. 8 is a structural view showing an example of the present invention.

Example 4 is an example in the case where the present invention is applied to a vertical cavity surface emitting laser of 1.3 µm band for optical fiber communications. FIG. 8 is a schematic view of this cross-sectional structure. The structure above the DBR layer(s) 102 is the same as that of Example 3, and 10 pairs of semiconductor layer pairs of the n-type InP layer 102*a* and n-type InGaAlAs multi-quantum-wells layer 102*b* of the DBR layer(s) 102 are provided. Below the DBR layer(s) 102, there are provided 6.5 pairs of DBR layer(s) 801 the DBR layer(s) 801 being composed of an undoped InP layer 801*a* and a layer 801*b* which is hollow and filled with air. The DBR layer(s) 801 is formed by alternatively laminating the InP layer 801*a* and the bulk InGaAlAs layer, by digging a trench 802 in a part of the periphery of the device, and by conducting the wet etching of the InGaAlAs layer from the side. For the wet etching solution, for example, a mixed-solution of sulfuric acid, a hydrogen peroxide solution, and water, or the like, that etches the InGaAlAs layer and not the InP layer is used. Since the trench, which provides an air gap, is provided in only a part of the periphery of the device, the entire device is connected to the substrate in the regions where the trench is not provided, and the shape is maintained. Moreover, in wet etching, the side walls of the DBR layer(s) 102 are protected by a resist or a dielectric film in advance so that the DBR layer(s) 102 can not be etched. Since the difference between the refractive index of the InP layer 801*a* and the refractive index of the air gap layer is large, a high reflectivity of 99% or more may be obtained with a small numbers of layers of 6.5 layers, and if combined with the DBR layer(s) 102, a high reflecting mirror with a reflectivity of 99.5% or more can be obtained. In this example, the electrode for n-type semiconductor 702 is provided on the n-type InP layer 102*a* of the DBR layer(s) 102 because electrical continuity to the InP layer 801 may not be obtained as in the case of Example 3.

For the threshold current of the vertical cavity surface emitting laser according to this example, low values such as 0.83 mA at 25° C., 1.8 mA at 85° C., and 2.1 mA even at 100° C. can be obtained due to a reduction in the optical absorption of the semiconductor DBR layer, and for the maximum optical output power, 1.8 mW at 85° C. and 1.2 mW at 100° C. can be obtained. When a test operation at 10 Gb/s is carried out using this vertical cavity surface emitting laser, an excellent eye opening with the extinction ratio of 5.2 dB can be obtained in the range from 0° C. to 100° C. at a low current value of driving current of 11 mA.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. The vertical cavity surface emitting semiconductor laser device for emitting light vertically to an InP substrate comprising an active layer that generates light onto the InP substrate and a cavity-structure in which the upper and lower sides of the active layer are sandwiched by first and second reflectors in order to obtain a lasing light from light generated from the active layer, wherein the first reflector laminated on the InP substrate is comprised of first semiconductor layers, the active layer is laminated above the first reflector, and the second reflector laminated above the active layer is comprised of second semiconductor layers or first dielectric layers, wherein a partial region of the first semiconductor layers is doped with impurities as to be a first conductivity type so that current can be injected from the first semiconductor layers to the active layer, and the first semiconductor layers comprise a plurality of pairs of a multi-quantum-wells layer and an InP layer, wherein the plurality of pairs are laminated alternatively and the multi-quantum-wells layer is comprised of InGaAlAs-wells and InGaAlAs-barriers, wherein the InGaAlAs-wells of the multi-quantum-wells layer within the first semiconductor layers in the first reflector are undoped, and the InGaAlAs-barriers are doped.

2. The vertical cavity surface emitting semiconductor laser device for emitting light vertically to an InP substrate comprising an active layer that generates light onto the InP substrate and a cavity-structure in which the upper and lower sides of the active layer are sandwiched by first and second reflectors in order to obtain a lasing light from light generated from the active layer, wherein the first reflector laminated on the InP substrate is comprised of first semiconductor layers, the active layer is laminated above the first reflector, and the second reflector laminated above the active layer is comprised of second semiconductor layers or first dielectric layers, wherein a partial region of the first semiconductor layers is doped with impurities as to be a first conductivity type so that current can be injected from the first semiconductor layers to the active layer, and the first semiconductor layers comprise a plurality of pairs of a multi-quantum-wells layer and an InP layer, wherein the plurality of pairs are laminated alternatively and the multi-quantum-wells layer is comprised of InGaAlAs-wells and InGaAlAs-barriers, wherein a doping concentration of the InGaAlAs-barriers is higher than a doping concentration of the InGaAlAs-wells of the multi-quantum-wells layer within the first semiconductor layers in the first reflector.

3. The vertical cavity surface emitting semiconductor laser device according to either claim 1 or claim 2, wherein at least a partial region of the first group of layers of the first semiconductor layers is doped, and the second group of layers of the first semiconductor layers is undoped.

4. The vertical cavity surface emitting semiconductor laser device according to either claim 1 or claim 2, wherein a wavelength that defines a composition of a compound semiconductor of the InGaAlAs-wells is in a range from 1.2 μm to 1.6 μm, and a wavelength that defines a composition of a compound semiconductor of the InGaAlAs-barriers is in a range from 0.88 μm to 1.15 μm.

5. The vertical cavity surface emitting semiconductor laser device according to either claim 1 or claim 2, further comprising a tunnel junction within semiconductor layers below the second reflector wherein the tunnel junction is formed on the active layer.

6. The vertical cavity surface emitting semiconductor laser device according to either claim 1 or claim 2, wherein an oscillation wavelength of laser is in a range from 1.2 μm to 1.6 μm band.

* * * * *